United States Patent
Schweitzer, III et al.

(10) Patent No.: US 10,228,409 B2
(45) Date of Patent: *Mar. 12, 2019

(54) FAULT LOCATION USING TRAVELING WAVES

(71) Applicant: Schweitzer Engineering Laboratories, Inc., Pullman, WA (US)

(72) Inventors: Edmund O. Schweitzer, III, Pullman, WA (US); Mangapathirao Venkata Mynam, Pullman, WA (US); Armando Guzman-Casillas, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/413,004

(22) Filed: Jan. 23, 2017

(65) Prior Publication Data

US 2017/0131343 A1   May 11, 2017

Related U.S. Application Data

(63) Continuation of application No. 14/603,540, filed on Jan. 23, 2015, now Pat. No. 9,588,168, which is a
(Continued)

(51) Int. Cl.
*H02H 1/00* (2006.01)
*H02H 7/26* (2006.01)
(Continued)

(52) U.S. Cl.
CPC ........... *G01R 31/088* (2013.01); *G01R 13/02* (2013.01); *G01R 31/08* (2013.01); *G01R 31/085* (2013.01);
(Continued)

(58) Field of Classification Search
CPC ...... G01R 31/08; G01R 31/085; G01R 31/11; H02H 1/003
(Continued)

(56) References Cited

U.S. PATENT DOCUMENTS 6,597,180 B1 * 7/2003 Takaoka ............... G01R 31/088
324/512
8,525,522 B2 * 9/2013 Gong ................... G01R 31/086
324/519
(Continued)

OTHER PUBLICATIONS

P. Crossley, M. Davidson and P. Gale, "Fault location using travelling waves", Instrumentation in the Electrical Supply Industry, IEE Colloquium on, London, 1993, pp. 6/1-6/3.*
(Continued)

*Primary Examiner* — Michael J Dalbo
(74) *Attorney, Agent, or Firm* — Bradley W. Schield; Richard M. Edge; Jared L. Cherry (57) ABSTRACT

The present disclosure relates to calculating a fault location in an electric power transmission system based on traveling waves. In one embodiment, a system consistent with the present disclosure may be configured to detect a fault in an electric power transmission system. The system may include a traveling wave detection subsystem configured to detect and measure traveling waves on a transmission line and a fault location estimation subsystem. The fault location estimation subsystem may receive from the traveling wave detection subsystem a first plurality of traveling waves on the transmission line generated during a reference event. The fault location estimation subsystem may receive from the traveling wave detection subsystem a second plurality of traveling waves generated during an unplanned event. An unmatched traveling wave in the second plurality of waves may be detected and a location of the unplanned event based on the unmatched traveling wave.

26 Claims, 8 Drawing Sheets

Related U.S. Application Data continuation-in-part of application No. 14/486,929, filed on Sep. 15, 2014, now Pat. No. 8,990,036.

(60) Provisional application No. 61/878,524, filed on Sep. 16, 2013.

(51) Int. Cl.
  *G01R 13/02* (2006.01)
  *G01R 31/11* (2006.01)
  *G01R 31/08* (2006.01)

(52) U.S. Cl.
  CPC ............ *G01R 31/11* (2013.01); *H02H 1/003* (2013.01); *H02H 1/0092* (2013.01); *H02H 7/265* (2013.01); *Y04S 10/522* (2013.01)

(58) Field of Classification Search
  USPC .................................................. 325/532, 533
  See application file for complete search history.

(56) References Cited

U.S. PATENT DOCUMENTS

| | | | | |
|---|---|---|---|---|
| 9,588,168 | B2* | 3/2017 | Schweitzer, III | G01R 31/088 |
| 2002/0169585 | A1* | 11/2002 | Jones | H04B 3/493 |
| | | | | 702/189 |
| 2004/0189317 | A1* | 9/2004 | Borchert | G01R 31/085 |
| | | | | 324/512 |
| 2006/0012374 | A1* | 1/2006 | Kojovic | G01R 31/085 |
| | | | | 324/522 |
| 2009/0088989 | A1* | 4/2009 | Guzman-Casillas | |
| | | | | G01R 31/088 |
| | | | | 702/58 |
| 2012/0256637 | A1* | 10/2012 | Juhlin | G01R 31/11 |
| | | | | 324/523 |

OTHER PUBLICATIONS

Zhang, "Peak alignment using wavelet pattern matching and differential evolution", Talanta, vol. 83, Issue 4, Jan. 30, 2011, pp. 1108-1117.*

Renforth, "On-Line and Off-line PD monitoring: The Experiences in testing MV and HV apparatus from an Industrial Point of View", Euro TechCon, 2013.*

Trevor Linsley, "Basic Electrical Installation Work: Sixth Edition", Routledge, May 27, 2011—Technology & Engineering.*

\* cited by examiner

FAULT LOCATION USING TRAVELING WAVES

RELATED APPLICATIONS

The present application claims priority under 35 U.S.C. § 120 as a continuation application of U.S. patent application Ser. No. 14/603,540, filed on 23 Jan. 2015, naming Edmund O. Schweitzer, III, Mangapathirao Venkata Mynam, and Armando Guzman-Casillas as inventors; which claims priority as a continuation-in-part of U.S. patent application Ser. No. 14/486,929, now U.S. Pat. No. 8,990,036, filed on 15 Sep. 2014 entitled "Power Line Parameter Adjustment and Fault Location Using Traveling Waves", which claims priority to U.S. provisional patent application Ser. No. 61/878,524, filed on 16 Sep. 2013, and entitled "Fault Location using Traveling Waves; each of which are incorporated herein by reference in their entireties.

TECHNICAL FIELD

This disclosure relates to calculating a fault location in an electric power transmission system based on traveling waves. More particularly, but not exclusively, this disclosure relates to techniques for calculating a fault location based on traveling waves created by a reference event and later using a record of the traveling waves from the reference event to identify a traveling wave associated with an uncontrolled event.

BRIEF DESCRIPTION OF THE DRAWINGS

Non-limiting and non-exhaustive embodiments of the disclosure are described, including various embodiments of the disclosure, with reference to the figures, in which.

DETAILED DESCRIPTION

Traveling wave fault location (TWFL) systems are commercially available in dedicated fault location equipment or as an additional function included in certain digital fault recorders. Some electric utilities in Canada and the USA use TWFL systems developed within the utility for internal use. The TWFL systems normally provide fault location information in a post-mortem fashion by analyzing current or voltage oscillograms—also known as event reports—from the fault. The fault location can be estimated using oscillograms from one terminal or all terminals of a transmission line. Multiple terminal TWFL systems use current or voltage samples with their corresponding time stamps according to Coordinated Universal Time to simplify calculations. These systems obtain the events from transmission line terminals and use a general purpose computer that runs software to determine a location of the fault.

Today, most line protective relays provide fault location estimation in real time using impedance-based algorithms. These algorithms use local voltage and current information and/or current and voltage information from the remote terminals. When using information from both terminals, the accuracy of the impedance-based fault location estimation can be within 1.5%. This accuracy may be a function of the line length. In most applications this accuracy is sufficient to promptly locate faults in lines with lengths of 20 mi or less. This accuracy may not be sufficient, however, for long lines (e.g., 150 mi length or longer). Therefore, a utility may elect to use a dedicated TWFL system. The accuracy of a TWFL system is not necessarily a function of line length and is typically within ±0.2 mi. TWFL systems are also suitable for series compensated lines while impedance-based fault location algorithms may not be well suited for such applications. For the above reasons, there is a need in the industry for protective relays with built-in TWFL capability.

One of the limitations of TWFL systems is that when a pre-fault voltage at the fault location is zero, the fault may not generate detectable high-frequency traveling waves. In these circumstances, the impedance-based fault location method can still locate the fault. Accordingly, in order to gather data regarding a traveling wave, continuous monitoring may be employed. According to some embodiments, including a TWFL system may be incorporated into a protective relay that continuously monitors a transmission line. Another benefit that may be realized, according to some embodiments disclosed herein, is that the fault location is calculated when there is an internal line fault, thereby avoiding nuisance fault location alarms for external events. An additional benefit that may be realized is that the protective relay can be applied to terminals with double breakers and provide fault location information when one of the breakers is out of service.

Fault location using traveling waves (TW) may be used to accurately identify faults with accuracies in the range of 1-2 tower spans, compared to 10 or 20 spans for the methods using impedance measurements. In double end TW fault locating, the wave arrival times at both ends are measured with a common time reference and are used together to calculate the fault location using Eq. 1.

$$m = \frac{L + (tL - tR) \times v}{2} \qquad \text{Eq. 1}$$

Where:
L is the line length.
tL is the TW arrival time at L.
tR is the TW arrival time at R.
v is the TW propagation velocity.

This method leverages the economical and broadly available technologies of digital communications and satellite based time synchronization. Most recently, digital communications devices designed for critical infrastructure provide absolute time over a wide-area network, independent of Global Positioning Systems (GPS).

Another TW fault locating method for determining a fault location using traveling waves consistent with the present disclosure uses TW information from one end of the line and eliminates need for precise relative timing and communications. To estimate fault location, this single-end fault locating technique uses the time difference between the first arrived TW and the successive reflection from the fault.

One challenge associated with the single-end fault location determination is to identify the reflection from the fault, and to ignore/discard the reflections from the neighboring stations, tap location and other discontinuities, including those located behind the measurement point in the adjacent equipment. This is especially challenging if high fidelity voltage measurements are not available, thus preventing the method from detecting TW directionality (i.e., determining if a given TW came from in front or from behind the measurement point).

To address the challenge of excluding the reflections from the neighboring stations, tap locations and other discontinuities, various embodiments of the present disclosure may utilize a reference train of waves captured during a reference event. In various embodiments, reference events may include line energization, external fault, automatic reclosing (without the fault), external switching, shunt reactor or capacitor bank energization, and the like. A reference event may be either be a planned (e.g., a line energization) or an unplanned event (e.g., an external fault). A train of traveling waves generated during a reference event, along with the TWs captured during a fault, may then be used to compute the fault location using the systems and methods disclosed herein.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic and/or processor executable instructions.

Figure 1:
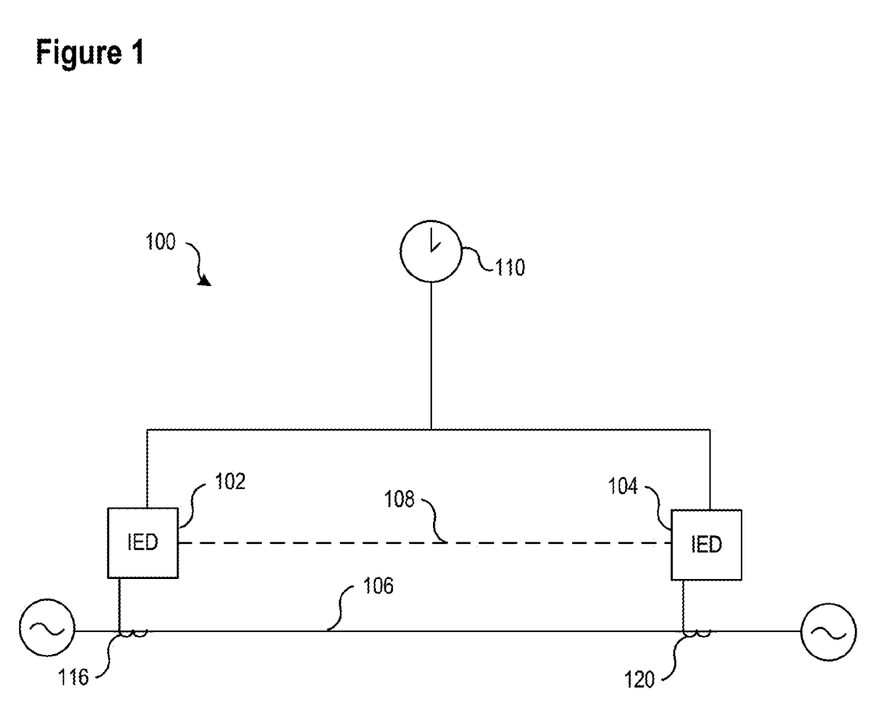
FIG. 1 illustrates a line diagram of a two-sided system for detecting a traveling wave on a transmission line and calculating a location of a fault consistent with certain embodiments of the disclosure.

FIG. 1 illustrates a line diagram of a two-sided system 100 for detecting a traveling wave on a conductor 106 and calculating a location of a fault consistent with certain embodiments of the disclosure. In various embodiments, conductor 106 may be one uniform/homogeneous conductor, one uniform/homogeneous conductor with a plurality of taps, or multiple sections of uniform/homogeneous conductor that may be overhead, underground, or both. System 100 may include generation, transmission, distribution and/or similar systems. System 100 includes a conductor 106 such as a transmission line connecting two nodes. Although illustrated in single-line form for purposes of simplicity, system 100 may be a multi-phase system, such as a three-phase electric power delivery system. System 100 is monitored by IEDs 102 and 104 at two locations of the system, although further IEDs may also be utilized to monitor further locations of the system. Various embodiments consistent with the present disclosure may be utilized in single end or radial systems.

IEDs 102 and 104 may obtain electric power system information using current transformers (CTs) 116 and 120, respectively. In other embodiments, potential transformers (PTs) may also be used to determine the voltage on conductor 106. IEDs 102 and 104 may receive common time information from a common time source 110. According to one embodiment, IEDs 102 and 104 may be embodied as line current differential relays (e.g., Model No. SEL-411L available from Schweitzer Engineering Laboratories (SEL) of Pullman, Wash.).

Common time source 110 may be any time source capable of delivering a common time signal to each of IEDs 102 and 104. Some examples of a common time source include a Global Navigational Satellite System (GNSS) such as the Global Positioning System (GPS) system delivering a time signal corresponding with IRIG, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from SEL). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, traveling waves. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data. According to one specific embodiment, communication channel 108 may be embodied as a 64 kbps bidirectional communication channel. In further embodiments, data communication channel 108 may be a wireless communication channel (e.g., a radio communication channel) utilizing any suitable wireless communication protocol.

Two-end fault locating methods, which may be referred to herein as Type D methods, may use a time difference between a traveling wave captured at both terminals along with the line length and wave propagation velocity to compute the fault location. Measurement devices at the line terminals detect the traveling waves and time stamp the arrival of the wave using a common time reference (e.g., IRIG-B or IEEE 1588). In certain embodiments, a distance to a fault location (m) is calculated using Eq. 1.

Traditionally these solutions use a master station that accesses the wave arrival times and estimates the fault location. Recently, line relays equipped with traveling wave fault locating function may exchange the wave arrival times, calculate the fault location, and make the fault location available at the relay. One of the key benefits of using the Type D method is its simplicity and immunity to reflections.

Figure 2A:
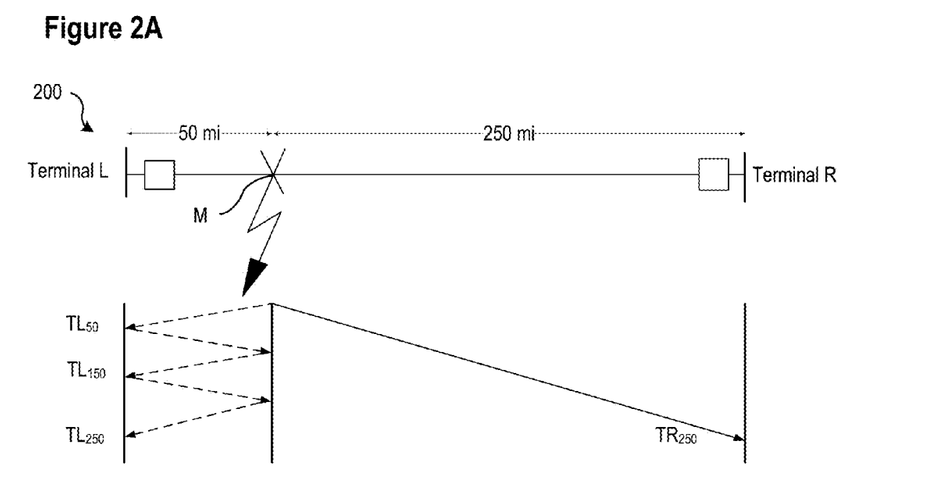
FIG. 2A illustrates a lattice diagram showing incident and reflected traveling waves over a relative time scale created by a fault event on a 300 mile (483 km) long transmission line monitored at a local and a remote terminal consistent with embodiments of the disclosure.

FIG. 2A illustrates a lattice diagram 200 showing incident and reflected traveling waves created by a fault consistent with certain embodiments of the disclosure. In the illustrated embodiment, a fault is located 50 miles (80 km) from a first terminal on a 300 mile (483 km) long line, at point M. The incident wave triggered by the fault reaches the terminal L at time $TL_{50}$, and reaches the terminal R at time $TR_{250}$. The Type D method may use the $TL_{50}$ and $TR_{250}$ to compute the fault location while ignoring all the other waves.

Figure 2B:
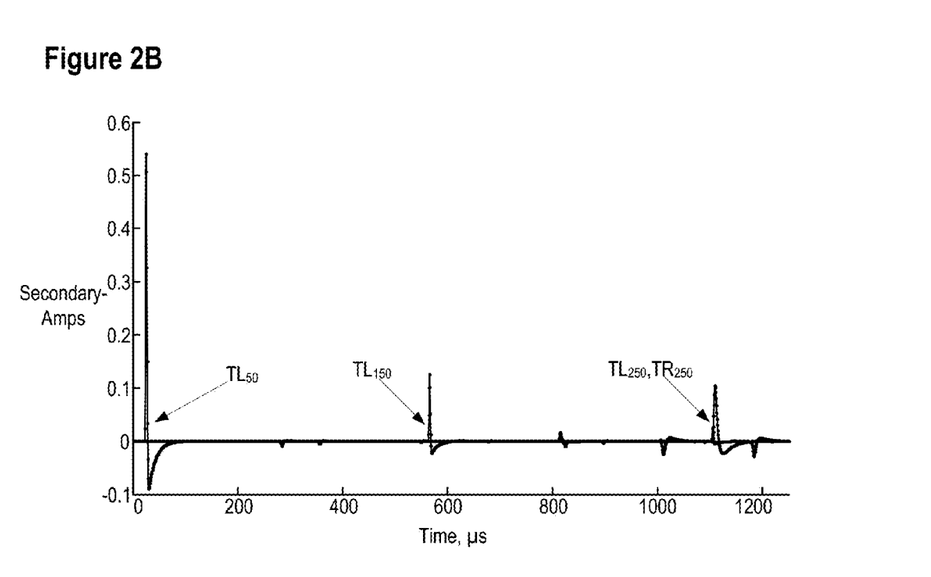
FIG. 2B illustrates a graph over time of the incident and reflected traveling waves from the fault illustrated in FIG. 2A consistent with embodiments of the present disclosure.

FIG. 2B illustrates a graph over time of the incident and reflected traveling waves from the fault illustrated in FIG. 2A consistent with embodiments of the present disclosure. As illustrated, the magnitude of the reflected traveling waves diminishes with each reflection. Time alignment of data samples received at both Terminal L and Terminal R allows for comparison of the incident and reflected waves from both terminals.

A single-end fault locating method, which is also referred to herein as a Type A fault locating method, uses the time difference between the first arrived traveling wave and a subsequent reflection from the fault or the remote terminal. The Type A method is not dependent on a communication channel to the remote terminal. However, the challenge is to identify and select the appropriate reflection.

The polarity, magnitude, and arrival time of the reflected waves can be used to identify the reflected wave from the fault or the remote terminal and calculate the fault location. At the L Terminal, the Type A method may use points labeled $TL_{50}$ and $TL_{150}$ in FIG. 2B to compute the fault location while ignoring other waves and reflections. In certain embodiments, a distance to a fault location (m) may be calculated using the Type A method using Equation 2.

$$m = \left(\frac{t_{L2} - t_{L1}}{2}\right) \cdot v \qquad \text{Eq. 2}$$

where: $t_{L2}$ is the arrival time of the first reflection from the fault at the L Terminal;
  $t_{L1}$ is the arrival time of the initial front wave from the fault at the L Terminal; and
  v is the wave propagation speed.

Certain embodiments may further utilize an impedance-based method to provide an estimate of a fault location. The term "impedance-based fault location" refers to any method that uses phasors of voltages and currents to determine a fault location. Certain embodiments may utilize band pass filtered signals with the useful bandwidth near the power system fundamental frequency.

The estimate of the fault location based on the impedance-based method may be used to establish a validation criteria for reflections and/or measurements used by a fault location system. One-ended or double-ended impedance-based fault locators calculate the fault location using the voltage and current measurements along with the positive and zero-sequence source impedances, $Z_0$ and $Z_1$. Impedance estimation systems may be accurate to within a few percent of the line length (e.g., approximately 0.5% to 2%). Using an estimate of the fault location from the impedance-based method, an approximate spacing of the waves reflected from the fault and the remote line terminal may be determined. In other embodiments, two-sided or impedance based fault location methods may be used to identify reflections from a fault.

Fault location systems using information from two or more terminals may be benefited by, among other things: (1) communicating reliably and (2) accurately time stamping measurements received at different locations. In certain circumstances, precise timing may not be available due to problems with the GPS clocks and antennas, poor weather conditions, GPS spoofing or jamming. Communications channels may be lost due to problems with fiber cables or communications devices, or any other network outage such as out of service condition for maintenance. Inability to use precise time at either of the line terminals or inability to communicate may render the double-end method unusable. At the same time each of the TWFL devices monitors availability and quality of both timing and communications. Upon detecting a problem in either of the two enabling technologies, fault detection systems consistent with the present disclosure may be able to fallback into a single-end TWFL method (i.e., using Equation 2 in place of Equation 1).

The single-end TWFL method has its own challenges, that may be caused by resolving the multiple reflections as described earlier (see FIG. 1), but it does not necessarily require absolute timing among a plurality of TWFL devices or communications among the plurality of TWFL devices. The internal clock of the TWFL device may be precise enough to provide correct timing information between the reflections at the line terminal. These times may not have to be referenced to any common time base, so the single-end method may function irrespective of any external time signals. The single-end method can be supported by the impedance-based method to aid in resolving the issue of multiple reflections without using measurements from a remote terminal.

Figure 3A:
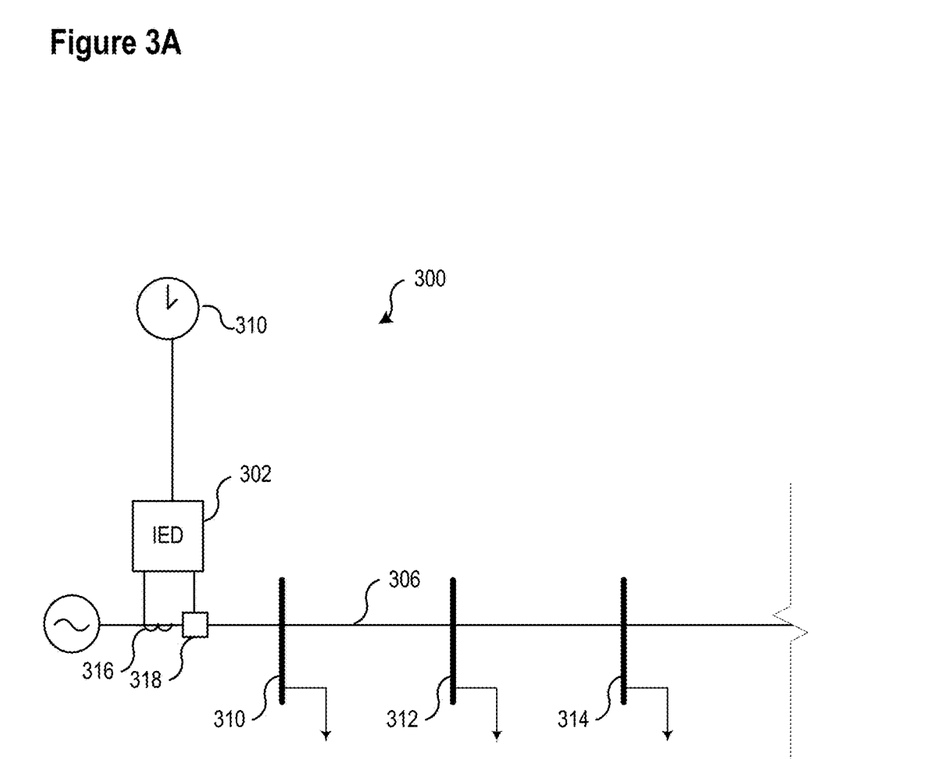
FIG. 3A illustrates a line diagram of a system for detecting a traveling wave in an electric power transmission system from one terminal and calculating a location of a fault consistent with certain embodiments of the disclosure.

FIG. 3A illustrates a line diagram of a system 300 for detecting a traveling wave in an electric power transmission system and calculating a location of a fault consistent with certain embodiments of the disclosure. System 300 may include generation, transmission, distribution and/or similar systems. System 300 includes a conductor 306 such as a transmission line connecting two nodes. Although illustrated in single-line form for purposes of simplicity, system 300 may be a multi-phase system, such as a three-phase electric power delivery system. System 300 is monitored by IED 302 at one location of the system.

IED 302 may monitor current in conductor 306 using a current transformer 316 to obtain electric power system information. In some embodiments consistent with the present disclosure, detection of traveling waves may be accomplished by monitoring a current flowing through the transmission line without reference to a voltage on the transmission line. Of course, in other embodiments, both voltage and current measurements may be analyzed to detect traveling waves.

IED 302 may receive time information from a time source 310. In some embodiments, a time source may be internal to IED 302. Time source 310 may be any time source capable of delivering a common time signal to IED 302. IED 302 may also be in communication with a breaker 318. Breaker 318 may selectively interrupt the flow of electric current through conductor 306. A plurality of taps 310, 312, and 314 may be in electric communication with conductor 306. The plurality of taps 310, 312, 314 may cause reflections in traveling waves on conductor 306. In other embodiments, a variety of types of discontinuities, in addition to taps, may cause additional reflections.

IED 302 may be configured in certain embodiments to record reflections following a reference event, such as energization of line 306. The reflections associated with a reference event may be referred to as a reference train. The reflections may be stored as a digital representation or an analog representation in various embodiments.

Figure 3B:
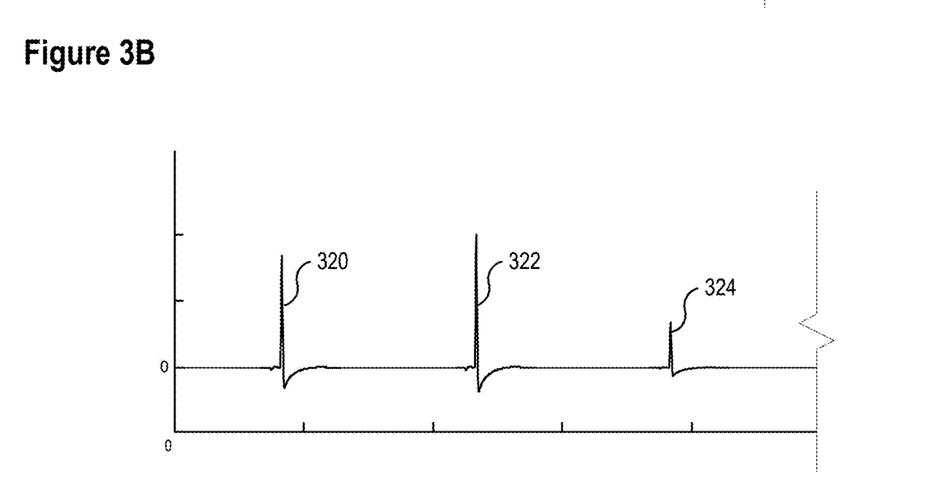
FIG. 3B illustrates a plot over time of a reference train of traveling waves generated during a reference event consistent with certain embodiments of the disclosure.

FIG. 3B illustrates a plot over time of a reference train of traveling waves generated during a reference event consistent with certain embodiments of the disclosure. As illustrated, the reference train may include reflections 320, 322, and 324, which correspond to taps 310, 312, and 314, respectively. Although the reflections in the specifically illustrated embodiment correspond to taps, other types of discontinuities in electric communication with conductor 306 may cause similar reflections in other embodiments.

Figure 4A:
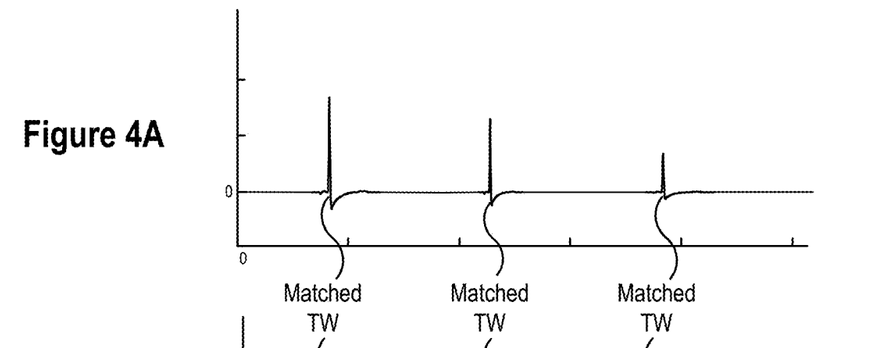
FIG. 4A illustrates a conceptual plot over time of a reference train of traveling waves generated during a reference event consistent with certain embodiments of the disclosure.

FIG. 4A illustrates a plot over time of a conceptual reference train of traveling waves generated during a reference event consistent with certain embodiments of the disclosure. The reference wave includes a plurality of reflections associated with three discontinuities on a transmission line. In some embodiments, the discontinuities may correspond to a plurality of taps on a transmission line or other types of discontinuities (e.g., transition between overhead and underground line segments).

Figure 4B:
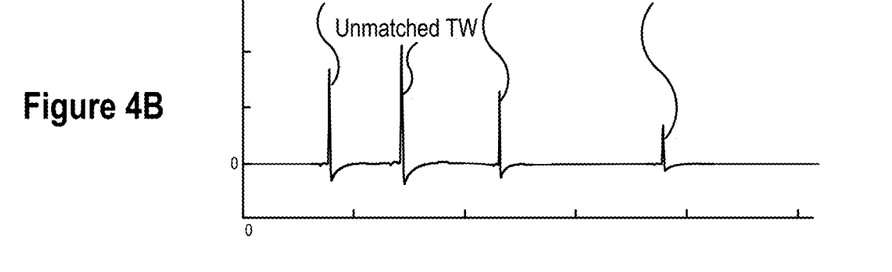
FIG. 4B illustrates a conceptual plot over time of a train of traveling waves generated during an uncontrolled event that includes a plurality of traveling waves matched in FIG. 4A consistent with certain embodiments of the disclosure.
Figure 4C:
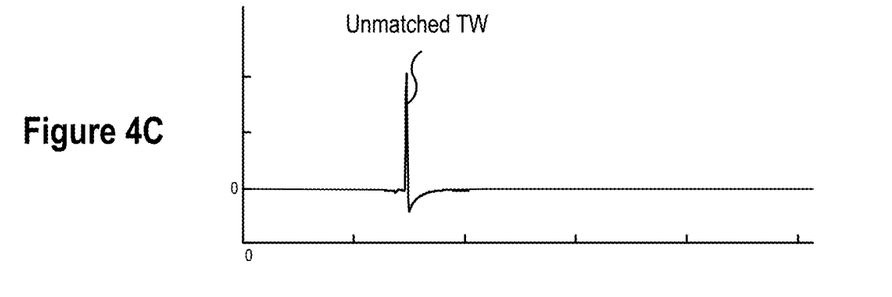
FIG. 4C illustrates a plot over time in which the matched traveling waves illustrated in FIG. 4A and FIG. 4B are selectively discarded and an unmatched traveling wave is identified consistent with certain embodiments of the disclosure.

FIG. 4B illustrates a plot over time of a conceptual train of traveling waves generated during an uncontrolled event that includes a plurality of traveling waves. The plot in FIG. 4B is aligned with the reference train of FIG. 4A based on a plurality of matched waves. As shown in FIG. 4C, the matched traveling waves illustrated in FIG. 4A and FIG. 4B may be selectively discarded to facilitate identification of one or more unmatched traveling waves. The unmatched traveling wave may correspond to an uncontrolled event, such as a fault on a transmission line. As may be appreciated, the reference wave train of FIG. 4A may be used to differentiate between an uncontrolled event, such as a fault, and other discontinuities that may cause traveling waves. As described above, identifying the correct reflection from the fault is a challenging task on a transmission line with multiple taps. Various signal processing techniques may be used to align the reference train shown in FIG. 4A with the waveform shown in FIG. 4B. Such techniques may also be used to identify the unmatched traveling wave, for example, correlation with the initial wave front signal.

A distance to the cause of the unplanned event may be determined using the unmatched traveling wave that are shown in FIGS. 4A and 4B. In one embodiment, the location may be determined using Eq. 3.

$$m = \frac{(t_{reflected} - t_{wave}) \times v}{2} \qquad \text{Eq. 3}$$

Where:
$t_{wave}$ is the first arrived TW arrival time
$t_{reflected}$ the reflected TW arrival time.
v is the TW propagation velocity.

Figure 4D:
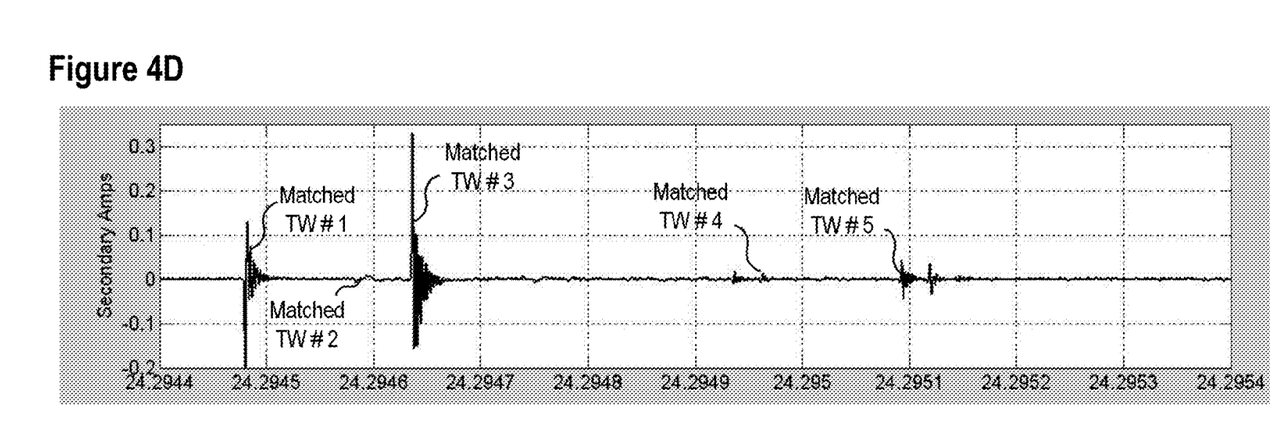
FIG. 4D illustrates actual measurements of a reference train of traveling waves generated during a reference event consistent with certain embodiments of the disclosure.
Figure 4E:
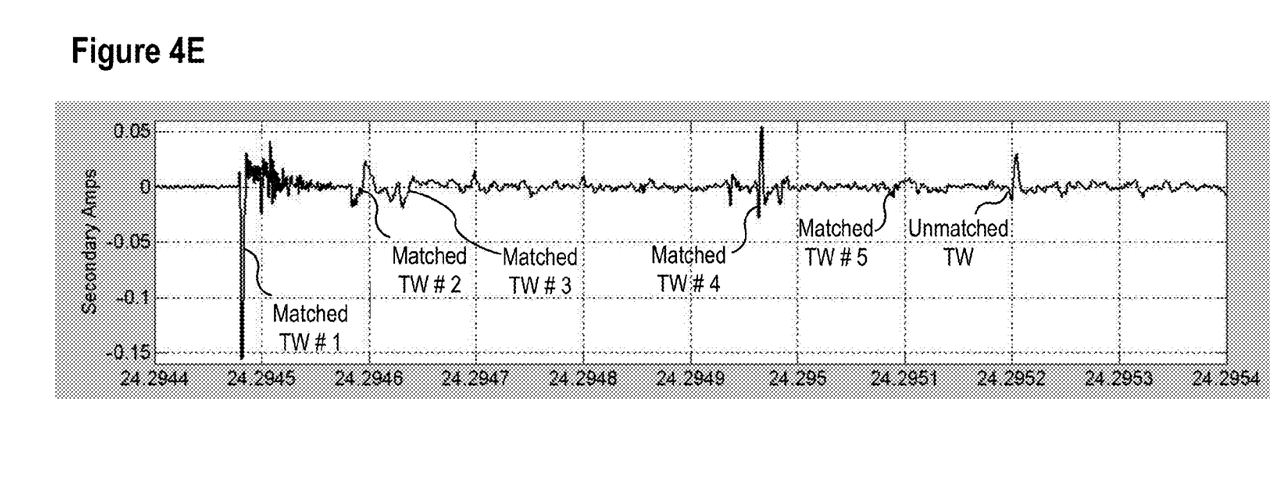
FIG. 4E illustrates actual measurements of a train of traveling waves generated during an uncontrolled event that includes a plurality of traveling waves matched in FIG. 4D consistent with embodiments of the disclosure.

FIG. 4D illustrates actual measurements of a reference train of traveling waves generated during a reference event consistent with certain embodiments of the disclosure. FIG. 4E illustrates actual measurements of a train of traveling waves generated during an uncontrolled event that includes a plurality of traveling waves matched in FIG. 4D. FIGS. 4D and 4E illustrate five sets of matched traveling waves. Although the matched traveling waves differ in various characteristics (e.g., amplitude, frequency of oscillation, duration, etc.) the times at which the matched traveling waves occur are tightly correlated. In some embodiments, multiple reference trains may be acquired and analyzed to more clearly identify static reflection points on a particular transmission line.

In other embodiments, the process illustrated graphically in FIGS. 4A-4C may be implemented in a numerical or tabular format. In one example, a table may be generated that lists time associated with known sources of reflections (e.g., taps, terminations, discontinuities, etc.) during a reference event. The times may be expressed as a time from the first wave. For example, Table 1 may show a table listing times associated with several known features of a transmission line that generate traveling waves.

TABLE 1

| Feature No. | Delta Time (ms) | Notes |
|---|---|---|
| 1 | 0.102 | Tap 1 |
| 2 | 0.135 | Station A |
| 3 | 0.457 | Tap 2 |
| 4 | 0.482 | Tap 3 |
| 5 | 0.986 | Tap 4 |
| 6 | 1.221 | Station B |
| ... | | |

Based on information associated with known reflections, such as information shown in Table 1, upon the occurrence of an uncontrolled event, a system may exclude reflections corresponding to known reflections. Accordingly, a traveling wave associated with the uncontrolled event may be identified and a distance to the location of the uncontrolled event may be determined.

In some embodiments, multiple tables or other representations of reflections associated with known sources may be recorded and stored for a plurality of reference events. The data generated from the plurality of reference events may be used to refine the reflections associated with known sources. Moreover, multiple tables or other representations of reflections associated with known sources may be generated at different locations. In the event of an uncontrolled event, such as a fault, the traveling waves received at different locations may be analyzed to estimate a location of the uncontrolled event.

In some embodiments, a user may be permitted to manually enter information pertaining to some or all of the known sources of reflections. For example, a user may enter known distances to a plurality of taps, stations, terminations, and the like. Based on this information, an IED implementing systems and methods consistent with the present disclosure may calculate the expected arrival times of reflections from known sources to distinguish between reflections from known sources and reflections generated by an unplanned event.

Figure 5:
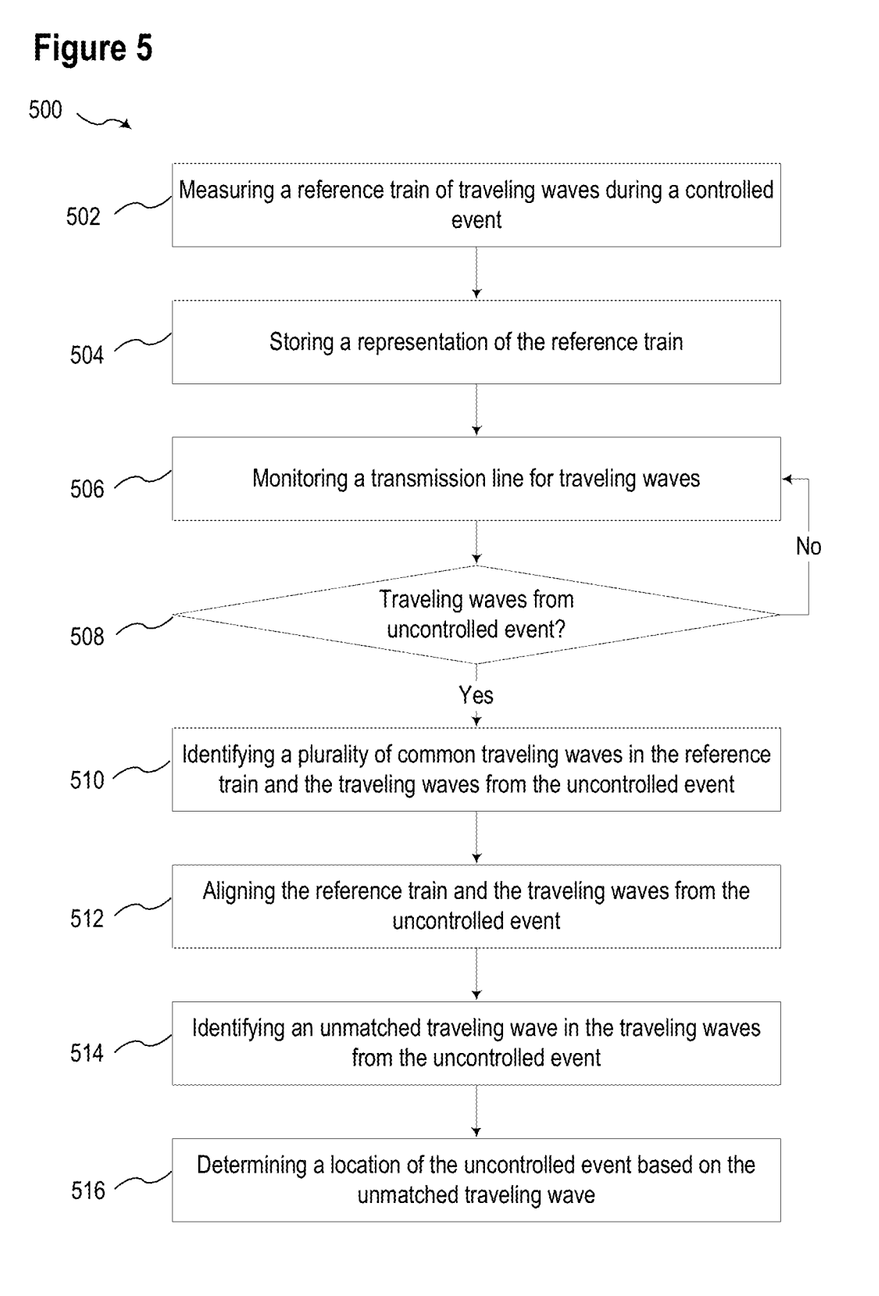
FIG. 5 illustrates a method for detecting a traveling wave in an electric power transmission system and calculating a location of a fault consistent with certain embodiments of the disclosure.

FIG. 5 illustrates a method 500 for detecting a traveling wave in an electric power transmission system and calculating a location of a fault consistent with certain embodiments of the disclosure. At 502, a reference train of traveling waves may be measured during a reference event. In various embodiments, the reference event may be an energization event of a transmission line. As the transmission line is energized, traveling waves may be reflected from various features on the transmission line. Such features may include taps, stations, terminations, and the like.

At 504, a representation of the reference train may be stored. In some embodiments, the representation may comprise a digital or analog representation of a current measurement. In other embodiments, the representation may comprise a table listing information associated with various sources of reflection. Such a table may include information regarding the time from the reference event to the detection of a first traveling wave. Subsequently received traveling waves may be represented in terms of the additional time before the traveling wave is received.

At 506 a transmission line may be monitored for traveling waves, and at 508, it may be determined whether any traveling waves originate from an uncontrolled event. Method 500 may continue to monitor the transmission line until traveling waves from an uncontrolled event are detected. An uncontrolled event may refer to a fault or other occurrence that creates traveling waves in an electric power distribution system.

At 510, a plurality of common traveling waves in the reference train and the traveling waves from the uncontrolled event may be identified, and at 512, the identified plurality of common traveling waves may be used to align the reference train and the traveling waves from the uncontrolled event. A variety of signal processing techniques known to a person of skill in the art may be utilized to correlate the reference train and a signal representing traveling waves from the uncontrolled event.

At 514, an unmatched traveling wave generated by the uncontrolled event may be identified. In some embodiments, identifying the unmatched traveling wave may be accomplished by selectively discarding the plurality of common traveling waves. In some embodiments, each of the plurality of traveling waves in the reference train may be used to set ranges of exclusion to compensate for effects such as dispersion that may distort traveling waves.

At 516, a location of the uncontrolled event may be determined based on the unmatched traveling wave. In some embodiments, multiple unmatched traveling waves may be identified. Such waves may, in some circumstances, be associated with multiple reflections originating from the uncontrolled event.

Figure 6:
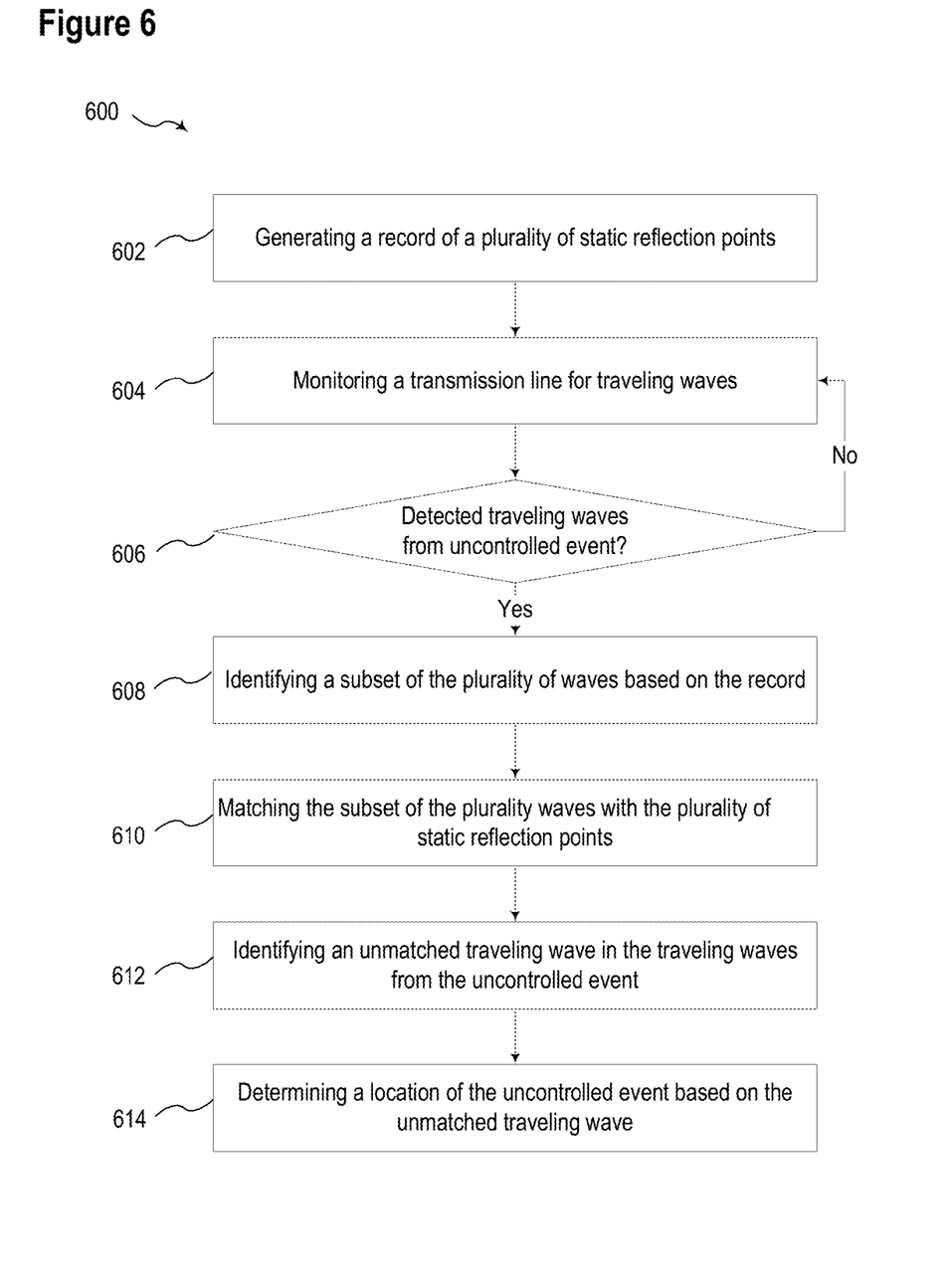
FIG. 6 illustrates another method for detecting a traveling wave in an electric power transmission system and calculating a location of a fault consistent with certain embodiments of the disclosure.

FIG. 6 illustrates another method 600 for detecting a traveling wave in an electric power transmission system and calculating a location of a fault consistent with certain embodiments of the disclosure. At 602, a record of a plurality of static reflection points may be generated. In various embodiments, the record may be generated automatically or may be entered manually by an operator of a system. In some embodiments, the record may be generated during a reference event, such as the energization of a transmission line. In embodiments where the record is generated either in whole or in part by a user, the location of taps, stations, terminations, and the like may be entered based on the topology of a particular system.

At 604 a transmission line may be monitored for traveling waves, and at 606, it may be determined whether any traveling waves originate from an uncontrolled event. Method 600 may continue to monitor the transmission line until traveling waves from an uncontrolled event are detected. An uncontrolled event may refer to a fault or other event that creates traveling waves in an electric power distribution system.

At 608, a subset of the plurality of detected traveling waves may be identified based on the record. In some embodiments, the record may provide an indication of a time differential representing the time for a traveling wave to reflect off of known reflection points. In such embodiments, the identifying of the plurality of waves may simply be identifying a period of time in which a reflection from known reflection points is expected.

At 610, the subset of the plurality of waves may be matched with the plurality of static reflection points. By matching a detected traveling wave with a known reflection point, the matched traveling wave may be excluded from further analysis to determine a location of the uncontrolled event. Identifying traveling waves generated by the uncontrolled event may be simplified by excluding the traveling waves associated with known points of reflection.

At 612, an unmatched traveling wave generated by the uncontrolled event may be identified, and at 614, a location of the uncontrolled event may be determined based on the unmatched traveling wave.

Figure 7:
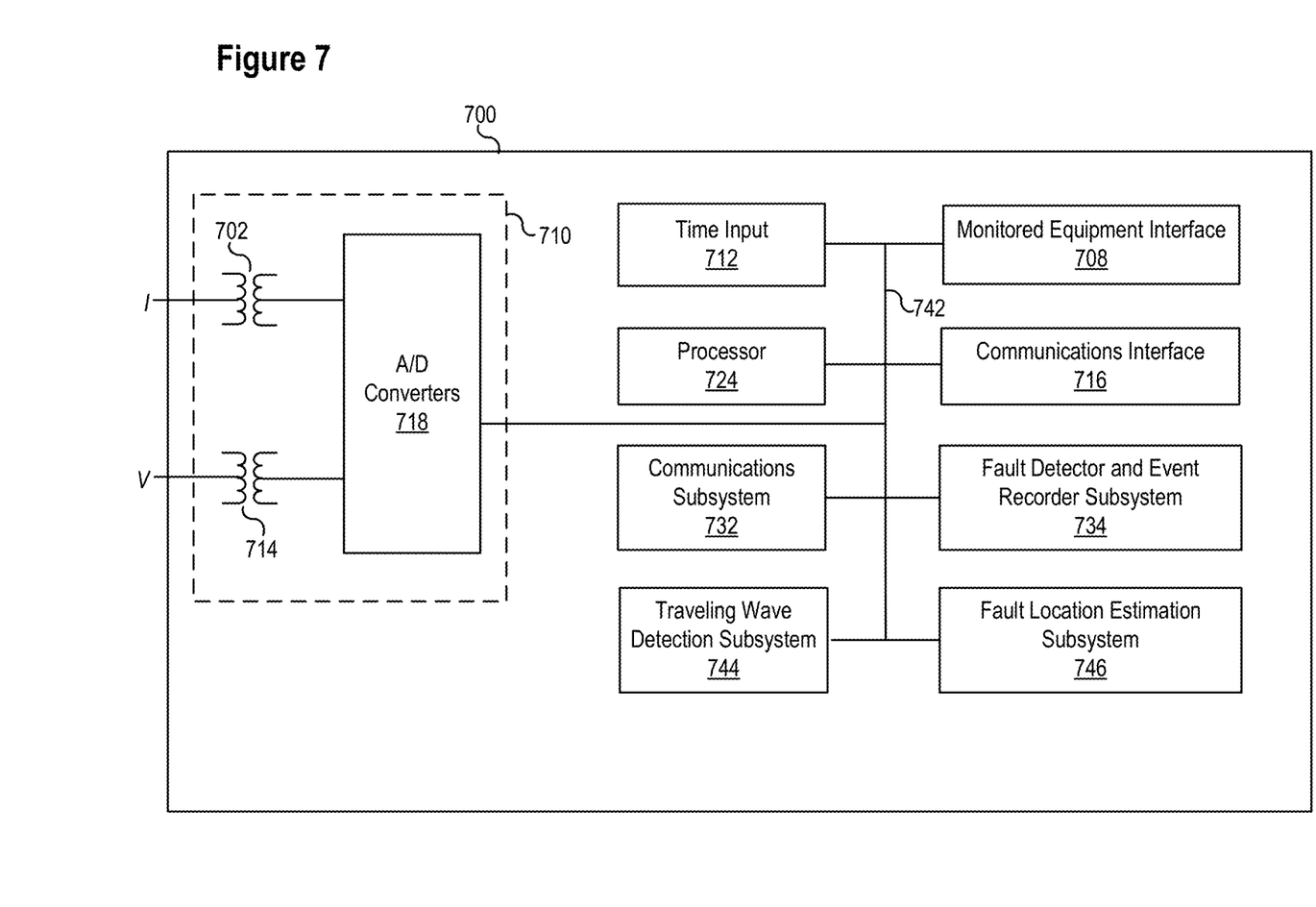
FIG. 7 illustrates a functional block diagram of a system for detecting faults and estimating a fault location using traveling waves consistent with certain embodiments of the present disclosure.

FIG. 7 illustrates a functional block diagram of a system 700 for detecting faults and estimating a fault location using traveling waves consistent with certain embodiments of the present disclosure. In certain embodiments, the system 700 may comprise an IED system configured to, among other things, detect faults using traveling waves and estimate a location of the fault. System 700 may be implemented in an IED using hardware, software, firmware, and/or any combination thereof. Moreover, certain components or functions described herein may be associated with other devices or performed by other devices. The specifically illustrated configuration is merely representative of one embodiment consistent with the present disclosure.

IED 700 includes a communications interface 716 configured to communicate with other IEDs and/or system devices. In certain embodiments, the communications interface 716 may facilitate direct communication with another IED or communicate with another IED over a communications network. Communications interface 716 may facilitate communications with multiple IEDs. IED 700 may further include a time input 712, which may be used to receive a time signal (e.g., a common time reference) allowing IED 700 to apply a time-stamp to the acquired samples. In certain embodiments, a common time reference may be received via communications interface 716, and accordingly, a separate time input may not be required for time-stamping and/or synchronization operations. One such embodiment may employ the IEEE 1588 protocol. A monitored equipment interface 708 may be configured to receive status information from, and issue control instructions to, a piece of monitored equipment (such as a circuit breaker, conductor, transformer, or the like).

Processor 724 may be configured to process communications received via communications interface 716, time input 712, and/or monitored equipment interface 708. Processor 724 may operate using any number of processing rates and architectures. Processor 724 may be configured to perform various algorithms and calculations described herein. Processor 724 may be embodied as a general purpose integrated circuit, an application specific integrated circuit, a field-programmable gate array, and/or any other suitable programmable logic device.

In certain embodiments, IED 700 may include a sensor component 710. In the illustrated embodiment, sensor component 710 is configured to gather data directly from equipment such as a conductor (not shown) and may use, for example, transformers 702 and 714 and A/D converters 718 that may sample and/or digitize filtered waveforms to form corresponding digitized current and voltage signals provided to data bus 742. Current (I) and voltage (V) inputs may be secondary inputs from instrument transformers such as, CTs and VTs. A/D converters 718 may include a single A/D converter or separate A/D converters for each incoming signal. A current signal may include separate current signals from each phase of a three-phase electric power system. A/D converters 718 may be connected to processor 724 by way of data bus 742, through which digitized representations of current and voltage signals may be transmitted to processor 724. In various embodiments, the digitized current and voltage signals may be used to calculate the location of a fault on an electric power line as described herein. The data bus 742 may link monitored equipment interface 708, time input 712, communications interface 716, and a plurality of additional subsystems.

A communications subsystem may be configured to allow IED 700 to communicate with any of a variety of external devices via communications interface 716. Communications subsystem 732 may be configured for communication using a variety of data communication protocols (e.g., Ethernet, IEC 61850, etc.).

Fault detector and event recorder subsystem 734 may collect data samples of a traveling wave current. The data samples may be associated with a timestamp and made available for retrieval and/or transmission to a remote IED via communications interface 716. Traveling waves may be measured and recorded in real-time, since they are transient signals that dissipate rapidly in an electric power delivery system. According to one embodiment, fault detector and event recorder 734 may selectively store and retrieve data and may make the data available for further processing.

A traveling wave detection subsystem 744 may detect traveling waves and record data values associated with the detected traveling waves (e.g., polarities, peak amplitudes, slopes, wave arrival, and the like).

Fault location estimation subsystem 746 may be configured to estimate a fault location based upon analysis of data regarding traveling waves. According to various embodiments, fault location estimation subsystem 746 may rely on one or more approaches for calculating the location of a fault. Fault location estimation subsystem 746 may be configured to rely on fault detection techniques described herein. Fault location estimation module 746 may be configured to utilize information from two terminals, if such information is available, or to estimate a fault location using information from only one terminal.

Fault location estimation subsystem 746 may utilize information relating to known discontinuities in identifying the location of a fault. Specifically, fault location estimation subsystem 746 may be configured to store a reference train of traveling waves generated during a reference event and/or to generate a record of known discontinuities. When analyzing a plurality of traveling waves, the fault location estimation subsystem 746 may be configured to discard traveling waves generated by the known discontinuities. In one embodiment, fault location subsystem 746 may be configured to calculate the reference train, in whole or in part, based on input from an operator indicating distances to known discontinuities.

While specific embodiments and applications of the disclosure have been illustrated and described, it is to be understood that the disclosure is not limited to the precise configurations and components disclosed herein. For example, the systems and methods described herein may be applied to an industrial electric power delivery system or an electric power delivery system implemented in a boat or oil platform that may not include long-distance transmission of high-voltage power. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system configured to detect an unplanned event in an electric power transmission system, the system comprising:
    a traveling wave detection subsystem configured to receive electric power transmission system measurements during a reference event and during an unplanned event, and calculate traveling waves using the electric power transmission system measurements;
    an event location estimation subsystem configured to:
        receive from the traveling wave detection subsystem a first plurality of detected traveling waves on the transmission line generated during a reference event;
        generate a reference train from the first plurality of detected traveling waves during the reference event the reference train defining timing of traveling wave reflections detected during the reference event;
        store the reference train;
        upon occurrence of an unplanned event, receive from the traveling wave detection subsystem a second plurality of detected traveling waves calculated from electric power transmission system measurements during the unplanned event, the traveling waves generated by the unplanned event;
        identify a plurality of matched traveling waves common in the reference train and the second plurality of traveling waves;
        align the reference train and the second plurality of traveling waves based on the plurality of matched traveling waves;
        generate a final stream of unplanned event traveling waves by identifying and including at least one unmatched traveling wave and a time of the unmatched traveling wave in the second plurality of waves as a traveling wave present in the second plurality of waves and not present in the reference train; and
        apply the final stream of unplanned event traveling waves to an event location estimation subsystem to calculate a distance to the unplanned event based on the time of the unmatched traveling wave and a predetermined traveling wave propagation velocity on the electric power transmission line; and,
    an interface to effect operational control of the electric power transmission system based on the calculated distance to the unplanned event.

2. The system of claim 1, wherein the unplanned event comprises an electric fault.

3. The system of claim 1, wherein the reference event comprises one of a planned event and an unplanned event.

4. The system of claim 1, wherein the first plurality of traveling waves and the second plurality of traveling waves are detected from a local terminal.

5. The system of claim 1, further comprising a communications interface configured to receive a second measurement indicative of the location of the unplanned event based on a traveling wave detected at a remote terminal.

6. The system of claim 5, further comprising a time interface configured to associate a time stamp with each of a plurality of measurements associated with the first plurality of traveling waves, the second plurality of traveling waves, and the second measurement.

7. The system of claim 1, wherein the reference event comprises one of a line energization event and an automatic reclosing event.

8. The system of claim 1, wherein the first plurality of traveling waves comprises at least one reflection from a tap on the transmission line.

9. The system of claim 1, wherein the first plurality of waves comprises a reflection from a discontinuity on the transmission line.

10. The system of claim 9, wherein the discontinuity comprises a transition from an overhead section of the transmission line to an underground section of the transmission line.

11. The system of claim 1, wherein the traveling wave detection subsystem further comprises a current sensor and the event location estimation subsystem is configured to determine the location of the unplanned event without reference to a voltage of the transmission line.

12. A system configured to detect an unplanned event in an electric power transmission system, the system comprising:
    a traveling wave detection subsystem configured to receive electric power transmission system measurements during a reference event and during an unplanned event, and calculate traveling waves using the electric power transmission system measurements;
    an event location estimation subsystem configured to:
        generate a first record of a plurality of static reflection points on the transmission line from detected traveling waves on the transmission line and corresponding traveling wave arrival times of the detected traveling waves during the reference event
        store the generated first record of the plurality of static reflection points;
        upon occurrence of an unplanned event, receive from the traveling wave detection subsystem a first plurality of detected traveling waves generated during the first unplanned event, the first plurality of traveling waves generated by the unplanned event;
        identify a subset of the first plurality of traveling waves based on the first record;
        match the subset of the first plurality of traveling waves with the plurality of static reflection points on the transmission line based on the first record;
        identify at least one unmatched traveling wave in the first plurality of traveling waves that is unmatched to any of the plurality of static reflection points and a time of the unmatched traveling wave;
        apply the at least one unmatched traveling wave generated by the unplanned event to an event location estimation subsystem to calculate a distance to the unplanned event based on the unmatched traveling wave, the time of the unmatched traveling wave, and the propagation velocity of the transmission line; and,
        effect operational control of the electric power transmission system based on the calculated distance to the unplanned event.

13. The system of claim 12, wherein the event location estimation subsystem is further configured to generate the first record of a plurality of static reflection points on the transmission line based on user input identifying the plurality of static reflection points.

14. The system of claim 12, wherein the first record comprises a representation indicating a plurality of differential times at which a traveling wave associated with each of the plurality of static reflection points arrives.

15. The system of claim 14, wherein the event location estimation subsystem is further configured to selectively discard a predetermined time period before and after each of the plurality of differential times.

16. The system of claim 12, wherein the plurality of static reflection points comprises at least one tap on the transmission line.

17. A method of detecting an unplanned event in an electric power transmission system using traveling waves, the method comprising:
  obtaining a first plurality of electric power transmission system measurements during a reference event at a first location on the electric power transmission system;
  calculating a first plurality of traveling waves on a transmission line of the electric power transmission system generated during a reference event at a first location using the first plurality of electric power transmission system measurements;
  storing a representation of the first plurality of traveling waves;
  obtaining a second plurality of electric power transmission system measurements during an unplanned event;
  calculating, from the second plurality of electric power transmission system measurements, a second plurality of traveling waves generated during the unplanned event, the second plurality of traveling waves generated by the unplanned event;
  identifying a plurality of matched traveling waves in the first plurality of traveling waves and the second plurality of traveling waves;
  aligning the first plurality of traveling waves and the second plurality of waves based on the plurality of matched traveling waves;
  identifying an unmatched traveling wave in the second plurality of waves and a time of the unmatched traveling wave;
  applying the unmatched traveling wave generated by the unplanned event to an event location estimation subsystem to calculate a distance to a location of the unplanned event based on the unmatched traveling wave, the time of the unmatched traveling wave and a propagation velocity of the transmission line; and,
  effecting operational control of the electric power transmission system based on the calculation of the distance to the location of the unplanned event.

18. The method of claim 17, wherein the first plurality of traveling waves is generated during one of a line energization event and an automatic reclosing event.

19. The method of claim 17, wherein detecting the second plurality of traveling waves comprises monitoring a current flowing through the transmission line without reference to a voltage of the transmission line.

20. The method of claim 17, wherein the first plurality of traveling waves comprises a subset of traveling waves corresponding to a plurality of taps on the transmission line.

21. The method of claim 17, wherein the first plurality of traveling waves comprises a subset of traveling waves corresponding to a discontinuity on the transmission line.

22. A method of detecting an unplanned event in an electric power transmission system, the method comprising:
  obtaining electric power transmission system measurements;
  generating a first record of a plurality of static reflection points on a transmission line of the electric power transmission system based on electric power transmission system measurements;
  detecting, from the electric power transmission system measurements, a first plurality of traveling waves generated during a first unplanned event the traveling waves generated by the first unplanned event;
  identifying a subset of the first plurality of traveling waves based on the first record;
  matching the subset of the first plurality of traveling waves with the plurality of static reflection points on the transmission line based on the first record;
  identifying at least one unmatched traveling wave in the first plurality of traveling waves that is unmatched to any of the plurality of static reflection points;
  identifying a time of the unmatched traveling wave;
  applying the at least one unmatched traveling wave generated by the unplanned event to an event location estimation subsystem to calculate a distance to the unplanned event based on the unmatched traveling wave, the time of the unmatched traveling wave and a propagation velocity of the transmission line; and,
  effecting operational control of the electric power transmission system based on the calculated distance to the unplanned event.

23. The method of claim 22, wherein generating the first record comprises receiving user input identifying a plurality of static reflection points.

24. The method of claim 22, wherein the first record of a plurality of static reflection points comprises a representation indicating a plurality of differential times at which a traveling wave associated with each of the plurality of static reflection points arrives.

25. The method of claim 24, further comprising:
  selectively discarding a predetermined time period before and after each of the plurality of differential times.

26. A system configured to detect an unplanned event in an electric power transmission system, the system comprising:
  a traveling wave detection subsystem configured to obtain electric power transmission system measurements, and to calculate traveling waves on a transmission line of the electric power transmission system from the electric power transmission system measurements;
  an event location estimation subsystem configured to:
    receive a plurality of distances corresponding to a plurality of known discontinuities on the transmission line;
    calculate a plurality of expected arrival times of reflections corresponding to the plurality of known discontinuities based on a propagation velocity of the transmission line;
    generate a reference train from the calculated plurality of expected arrival times of reflections;
    receive from the traveling wave detection subsystem a second plurality of arrival times of traveling wave reflections calculated from the electric power transmission system measurements, the traveling wave generated by an unplanned event;
    identify a plurality of matched arrival times between the reference train and the second plurality of arrival times;
    identify an unmatched arrival time in the second plurality of arrival times and including unmatched arrival time in a final stream; and
    apply the final stream of unplanned event traveling waves to an event location estimation subsystem to calculate a distance to the unplanned event based on the unmatched arrival time and the propagation velocity of the transmission line; and, an interface to effect operational control of the electric power transmission system based on the calculated distance to the unplanned event.

* * * * *